United States Patent [19]

Curtice

[11] Patent Number: 4,608,583
[45] Date of Patent: Aug. 26, 1986

[54] FET AMPLIFIER

[75] Inventor: Walter R. Curtice, Princeton Junction, N.J.

[73] Assignee: RCA Corporation, Princeton, N.J.

[21] Appl. No.: 782,160

[22] Filed: Oct. 2, 1985

Related U.S. Application Data

[63] Continuation of Ser. No. 497,158, May 23, 1983, abandoned.

[51] Int. Cl.[4] .............................................. H01L 29/80
[52] U.S. Cl. ....................................... 357/22; 357/15; 357/68
[58] Field of Search .............................. 357/15, 22, 68

[56] References Cited

U.S. PATENT DOCUMENTS

| 4,048,646 | 9/1977 | Ogawa et al. | 357/22 |
| 4,160,259 | 7/1979 | Nishizawa | 357/22 |
| 4,459,556 | 7/1984 | Nanbu et al. | 357/22 |

OTHER PUBLICATIONS

"Wave-Theoretical Analysis of Signal Propagation on FET Electrodes," W. Heinrich et al; Electronic Letters, 20 Jan. 1983, vol. 19, No. 2, pp. 65-67.
"Novel Design of Travelling Wave FET", CE-Jun Wei (Mar. 24, 1983), Electronics Letters, 6/23/83, pp. 461-463.

Primary Examiner—Edward J. Wojciechowicz
Attorney, Agent, or Firm—Birgit E. Morris; William J. Burke; Henry Steckler

[57] ABSTRACT

High power operation of an amplifier is more easily achieved in the 15 GHz and higher portion of the radio frequency spectrum by utilizing transmission line techniques to form the elements of the amplifier. Source, drain and gate members are arranged as elements of a radio frequency transmission line on a doped, semiconductor surface. When properly biased, the device operates as an amplifier.

10 Claims, 2 Drawing Figures

FET AMPLIFIER

This is a continuation of application Ser. No. 497,158, filed 5/23/83, now abandoned.

BACKGROUND OF THE INVENTION

This invention relates, in general, to monolithic semiconductor devices and more particularly, to a semiconductor structure having further applicability as a high power, high frequency MESFET power amplifier.

When the prior art was desirous of producing gallium arsenide (GaAs) MESFET devices having high radio frequency (RF) power output, traditionally, the device was made as wide as possible. However, as the width of the device becomes an appreciable fraction of its RF wave-length, both the RF power and the gain per unit width is significantly reduced as its width is increased. This effect becomes more apparent as one endeavors to make very high frequency GaAs MESFET's in the 15 gigahertz (GHz) and higher region of the RF spectrum. As will be hereinafter used, the long dimension of the gate will be referred to as the gate width or periphery while the short dimension refers to the gate length.

One of the prior art difficulties resides in the fact that there is no provision in the conventionally constructed device to permit application of the input signal, in the proper phase, to each part of the device width. Similarly, extraction of the output signal, not in the proper phase over the device width for additive power, contributed to additional power loss.

One method of solving the problem of the dimensional limitations would be to construct the device using transmission line techniques. However, there is no present structure which permits application of a 15 GHz and higher input signal, in the proper phase, to each part of the device width nor is there any structure suitable for the extraction of a properly phased, amplified output signal. Additionally, if the phase velocity of the input signal (at the gate-source transmission line) is significantly different than the corresponding phase velocity of the output signal (at the drain-source transmission line) both the gain of the device and the output power would be significantly reduced.

SUMMARY OF THE INVENTION

I have found that, by utilizing quasi-symmetric, coplanar transmission line or waveguide techniques, I am able to provide a monolithic semiconductor amplifier device capable of operating at higher frequencies than previously possible.

DETAILED DESCRIPTION OF THE PREFERRED EMBODIMENT

Figure 1:
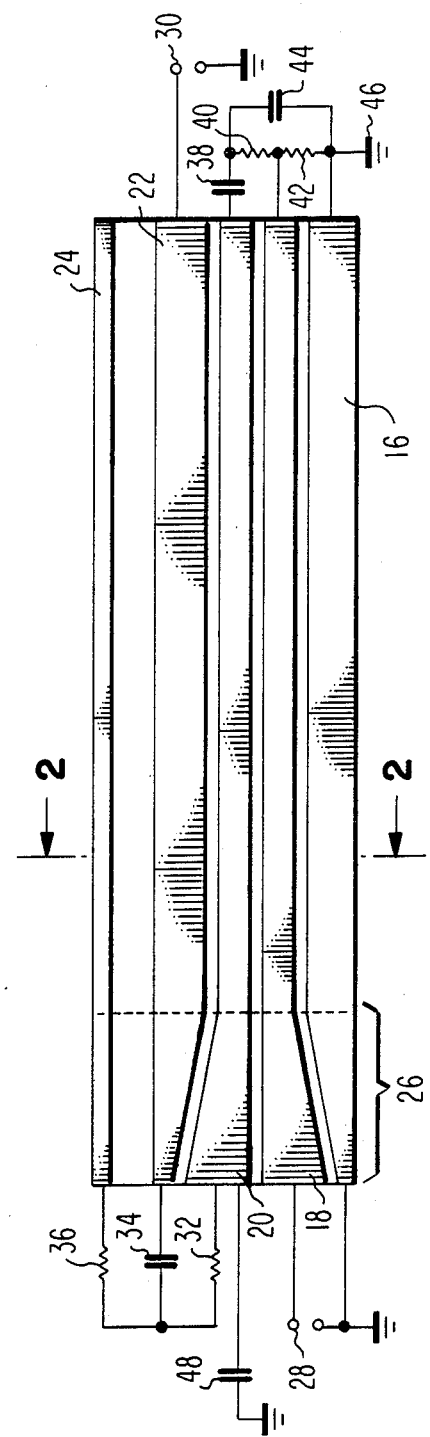
FIG. 1 is a plan view of a monolithic, semiconductor high frequency amplifier constructed in accordance with the teachings of my invention.
Figure 2:
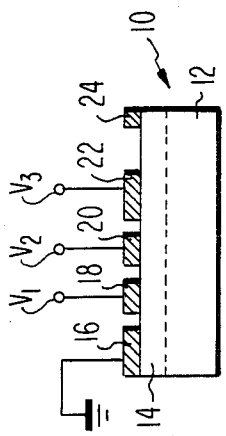
FIG. 2 is a cross-sectional, elevation view of the device of FIG. 1 taken along line 2—2 of FIG. 1.

In the following description, it should be noted that similar elements, in the various figures, will be similarly numbered. Referring now to FIGS. 1 and 2 there is shown a device made in accordance with the teachings of my invention. In these figures, amplifier 10 is formed on a substrate 12 of, for example, a semi-insulating semiconductor material such as GaAs that is provided with a highly doped n layer 14 of gallium arsenide. Layer 14 has a typical n dopant concentration of about $10^{17}/cm^3$ and has a thickness which may range from about 0.2 to 0.5 microns. Layer 14 may be implanted or doped, to provide the necessary n concentration as is well known in the art. After layer 14 is formed, the various elements are then deposited using any one of many of photolithographic techniques. AuGe/Ni/Au ohmic contacts, for lines 16 and 22, are deposited on the upper surface of layer 14 using a photolithographic technique, after which, the contacts are alloyed. The next step might be a lift-off process in which photoresist, for the one micron spacing between patterned lines, is deposited on the surface layer 14 and the gate metal (Ti/Pt/Au) is deposited over both the unmasked portions as well as over the masking lines previously formed on layer 14. Thereafter, the photoresist layer is removed, together with the metal deposited thereon, leaving only electrodes 18, 20, and 24 in Schottky contact and electrodes 16 and 22 in ohmic contact with the upper surface of layer 14.

It should be noted that the signal input to my amplifier is provided by means of a tapered transition region 26 which serves to match the impedance of the input signal to the input impedance of amplifier 10. The input to the transmission line of my device consists of the Schottky barrier gate 18 as the center line or conductor and the source electrode or line 16. Source line 16 is connected directly to ground 46, while a second Schottky barrier gate 20 is also maintained at RF ground through capacitors 38, 44 and 48. By maintaining Schottky barrier electrode 20 at RF ground potential, I have found that it not only serves to complete the symmetric input structure but, in addition, serves to decouple, for RF, drain line 22 from Schottky barrier gate line 18. A result of maintaining electrode line 20 at RF ground potential is a significant reduction in feedback capacitance. Lowering the feedback capacitances, at high RF frequencies, allows operation of the device over a broader range of frequencies.

RF input power is applied through matching transition region 26 at input terminal 28 and reference ground at one end of the structure, and the device is matched at it's output end with resistors 40 and 42. It will be understood by those skilled in the art that, in addition to using a resistive matching network (40, 42), as shown at the output, a standard impedance transformation may be used, similar to input section 26, at the output. Resistors 32 and 36, together with RF by-pass capacitor 34, represents a matching network used to lower or minimize any voltage standing-wave that may appear in the drain-source transmission line. Further, it will be understood by those skilled in the art that it would be desirable to match the drain-source transmission line at output terminal 30 and reference ground. Similarly, resistors 40 and 42 together with capacitors 38 and 44 also serve as a matching network to lower or minimize any standing waves that may appear at the output end of the gate-source transmission line.

If one were interested in designing a MESFET for operation in the 15 GHz portion of the spectrum and higher, typical dimensions would result in a gate length for gates 18 and 20 of about 1 micron and a spacing of about 1 micron between source 16 and gate 18. A 1 micron spacing would be provided between gates 18 and 20 as well as a 1 micron spacing provided between gate 20 and drain 22. From these dimensions one would fine that the characteristic impedance of the coplanar, high frequency gate-source transmission line structure would be about 25 ohms, which is a reasonable value for impedance matching. Assuming, that the entire width of the device is about 3000 microns and that the effective dielectric constant is about 50, the RF wave length ($\lambda$) will be about 0.3 centimeter and the phase shift over the device width will be about 360°. Under these circumstances, the input signal is applied, in a distributed fashion, from the input terminal 28 to the output along the gate-source transmission line and the output signal at terminal 30 is collected, in a distributed fashion, along the drain-source transmission line.

In the structure shown in FIG's 1 and 2, the various D.C. bias potentials would be applied as follows:

$V_3$, the voltage applied to drain 22, would typically be positive with respect to ground;

$V_1$, the voltage applied to Schottky gate 18, would typically be negative with respect to ground, but is adjusted to achieve proper drain-source bias current;

$V_2$, the voltage applied to Schottky gate 20, would typically be positive with respect to ground and would be adjustable. In this instance, $V_2$ is adjusted for maximum amplifier gain by matching the wave velocity in the drain-source transmission line with the wave velocity in the gate-source transmission line. Thus, the voltage adjustments to $V_2$ will vary the depletion layer capacitance per unit length appearing in layer 14, under gate 20 to provide any wave velocity changes that may be required. It will be understood that if source line 16 is maintained at any potential other than ground, the relative potentials of voltages $V_1$, $V_2$ and $V_3$ will be unchanged with respect to the voltage applied to source line 16.

Line 24 has been included in the event that a symmetrical structure (about drain 22) is desired. Additionally, portions of line 24 may be used. However, it is not necessary for the operation of the device as described.

While I have described my novel amplifier in terms of a gallium arsenide substrate 12 and doped gallium arsenide layer 14, it will be obvious that other substances may be used. For example, an indium phosphide substrate may also be used with either a doped gallium, indium arsenide layer 14 or with a doped layer of indium phosphide for layer 14.

Thus, I have described a novel MESFET amplifier which, because of its construction, provides higher RF power output and greater gain at higher frequencies than heretofore possible.

What I claim is:

1. A solid state transmission line, field effect transistor (FET) radio frequency amplifier, said amplifier having an input impedance and an output impedance, comprising:
    a body of semiconductor material having at least one planar surface;
    a layer of doped semiconductor material positioned on the planar surface;
    a plurality of substantially parallel conductive lines formed on the layer of doped material;
    the plurality of lines arranged on the doped semiconductor layer as radio frequency transmission lines with respect to each other to support at a given wavelength a wave travelling parallel to the longitudinal axes of said lines;
    said lines having an input section and an output section and being arranged on said layer in spaced sequence, respectively, as a source line, a first rectifying gate line, a second rectifying gate line and a drain line of said FET;
    said input section of said lines being formed into a tapered transmission line arranged to match the source impedance of an input signal to the input impedance of said amplifier;
    a signal input means comprising two input terminals connected, respectively, to the first gate line and said source line of said tapered section, said source line being connected to ground;
    a signal output means connected to said output section of said lines including two output terminals connected, respectively, to the drain line and ground of the output section of said lines; and
    means for providing an RF ground connection to said second gate line for isolating RF signals on said drain line from RF signals on said first gate line.

2. The amplifier of claim 1, wherein:
    the source line and drain line are respectively in ohmic contact with the doped material; and
    the first and second gate lines are in Schottky contact with the doped material.

3. The amplifier of claim 1, wherein:
    the drain line has a D.C. bias voltage applied thereto that is positive with respect to the source line;
    the first gate line has a D.C. bias voltage applied thereto that is negative with respect to the source line; and
    the second gate line has a D.C. bias voltage applied thereto that is positive with respect to the source line whereby the wave velocity of the signal in the drain-source transmission line can be adjusted to adjust the gain of the amplifier.

4. The amplifier of claim 3, wherein:
    the body of semiconductor material is gallium arsenide; and
    the doped layer is a layer of gallium arsenide doped to a concentration of about $10^{17}/cm^3$ and has a thickness ranging from about 0.2 to 0.5 microns.

5. The amplifier of claim 4, wherein:
    the source and drain lines are comprised of a layer of a AuGe/Ni/Au alloy; and
    the first and second gate lines are comprised of a layer of Ti/Pt/Au.

6. The amplifier of claim 3, wherein:
    the body of semiconductor material is indium phosphide and the doped layer is either doped gallium indium arsenide or indium phosphide; and
    the doped layer has a thickness ranging from about 0.2 to about 0.5 microns.

7. An amplifier according to claim 1 further including an additional conductive line positioned adjacent to said drain line and in Schottky contact with said surface.

8. An amplifier according to claim 1 wherein said isolating means comprises a first capacitor connected between the input end of said second gate line and said ground and a second capacitor connected between the output end of said second gate line and said ground.

9. An amplifier according to claim 7 further including an impedance matching network comprising:
    a third capacitor connected to the input section of said drain line between a first and second resistor connected commonly to said capacitor and to the input end of said additional line and said second gate, to thereby reduce standing wave voltages on said drain source transmission line.

10. An amplifier according to claim 7 further including an impedance matching network comprising grounded resistive termination means for the output section of said second gate line, said first gate line and said source line to thereby reduce standing wave voltages on said gate source transmission line.

* * * * *